United States Patent [19]

Bozzuto, Jr.

[11] Patent Number: 4,777,375

[45] Date of Patent: Oct. 11, 1988

[54] INTRINSICALLY SAFE MATRIX KEYPAD HAVING OPTO-COUPLERS ASSOCIATED WITH EACH ROW AND COLUMN OF SWITCHES

[75] Inventor: Richard C. Bozzuto, Jr., Plantsville, Conn.

[73] Assignee: Teleco Oilfield Services Inc., Meriden, Conn.

[21] Appl. No.: 79,660

[22] Filed: Jul. 29, 1987

[51] Int. Cl.[4] ............................................ G02B 27/00
[52] U.S. Cl. ................................ 250/551; 340/365 P; 250/229
[58] Field of Search ............... 250/551, 229, 208, 209; 307/311; 340/365 P

[56] References Cited

U.S. PATENT DOCUMENTS

| | | | |
|---|---|---|---|
| 3,562,540 | 2/1971 | Hirsch | 250/227 |
| 3,808,502 | 4/1974 | Babilius | 128/908 |
| 4,245,650 | 1/1981 | Welker et al. | 128/909 |
| 4,254,407 | 3/1981 | Tipon | 340/365 P |
| 4,311,990 | 1/1982 | Burke | 340/365 P |
| 4,362,934 | 12/1982 | McLey | 307/311 |
| 4,417,824 | 11/1983 | Paterson et al. | 340/365 P |
| 4,442,425 | 4/1984 | Eiber | 340/365 P |
| 4,481,423 | 11/1984 | Conway | 250/551 |
| 4,495,421 | 1/1985 | Endo et al. | 250/551 |
| 4,639,727 | 1/1987 | Blasius et al. | 307/311 |

Primary Examiner—David C. Nelms
Assistant Examiner—William L. Oen
Attorney, Agent, or Firm—Fishman, Dionne & Cantor

[57] ABSTRACT

A matrix keypad is rendered intrinsically safe by use of a circuit employing a plurality of opto-couplers powered by a single intrinsically safe (IS) barrier.

12 Claims, 1 Drawing Sheet

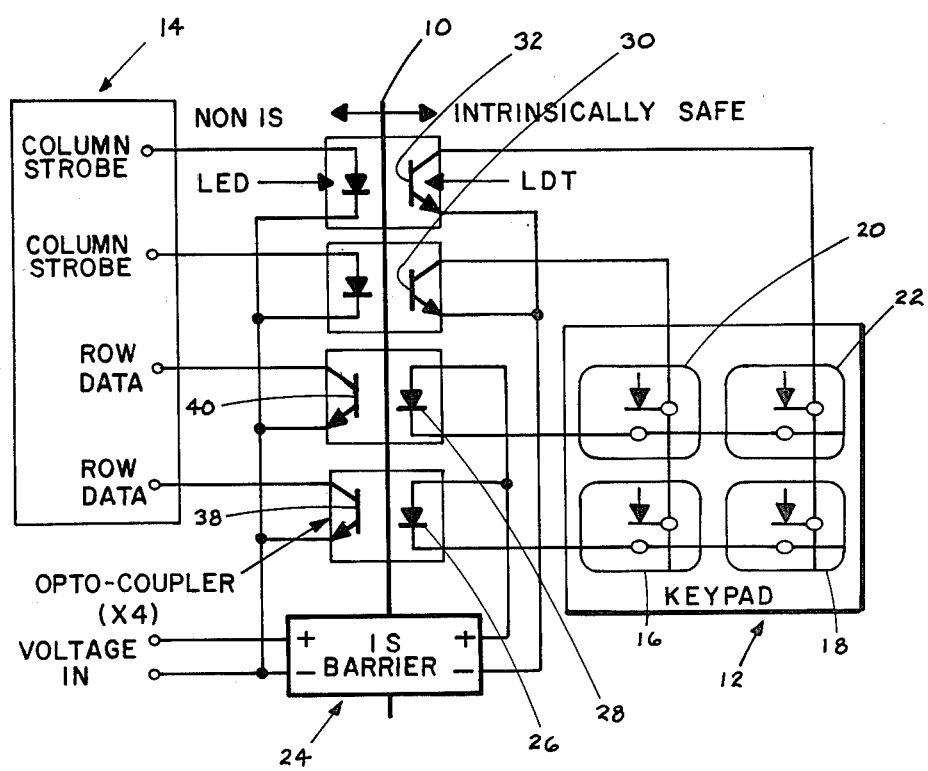

INTRINSICALLY SAFE MATRIX KEYPAD HAVING OPTO-COUPLERS ASSOCIATED WITH EACH ROW AND COLUMN OF SWITCHES

BACKGROUND OF THE INVENTION

This invention relates to an intrinsically safe (IS) membrane or matrix keyboard. More particularly, this invention relates to the use of opto-couplers and a single IS barrier to thereby render a matrix keypad or keyboard intrinsically safe.

As is well known, in the electronic circuit design field, the term "Intrinsically Safe", means that the amount of power (voltage×current) or energy in use in a given circuit is less than that level of power required to ignite an explosive mixture of gas. The use of Intrinsic Safety (IS) as a method of circuit protection demands that every conductor (e.g. wire) entering a hazardous area be isolated so that the energy which is being transmitted into the hazardous area will be safe (e.g. below the level necessary for an explosion to occur).

Matrix or membrane keyboards have a well known structure and consist of an array of switches configured into a fixed number of rows and columns. Each individual row and column is connected to keyboard scanning circuitry by a separate wire. When the keypad is located in a hazardous environment, the keyboard scanning circuitry is located in a remote non-hazardous area with the separate wires providing the link between the keypad (hazardous area) and the keypad scanning circuitry (non-hazardous area). In order to render the keypad "Intrinsically Safe", a separate barrier must be used to protect each individual wire. These barriers are known as Intrinsically Safe barriers (hereinafter "IS barriers") and are commercially available units which utilize a transformer unit or Zener diode unit.

Unfortunately, the use of a separate IS barrier for each wire which runs into and out of the keypad leads to several important drawbacks. For example, a multiplicity of IS barriers results in a bulky and cumbersome approach to protecting the keypad. Moreover, the use of a plurality of IS barriers is quite expensive both in terms of purchasing and labor costs.

SUMMARY OF THE INVENTION

The above discussed and other deficiencies and drawbacks of the prior art are overcome or alleviated by the Intrinsically Safe matrix keypad of the present invention. In accordance with the present invention, a matrix keypad is rendered Intrinsically Safe by the use of opto-couplers to protect the individual wires which enter and exit the keypad. An important feature of the present invention is that only a single IS barrier is required to power the keypad. This is accomplished by configuring the keypad as an active IS circuit rather than a passive switch matrix. As a result, each of the individual row and column lines (e.g. wires or conductors), can be isolated with opto-couplers rather than IS barriers.

The opto-couplers are substantially smaller, lighter and less expensive than IS barriers leading to an IS matrix keypad which is smaller, less cumbersome and less expensive relative to prior art IS keypads which use a multiplicity of IS barriers (e.g. one IS barrier for each wire).

The above discussed and other features and advantages of the present invention will be appreciated and understood by those skilled in the art from the following detailed description and drawing.

BRIEF DESCRIPTION OF THE DRAWINGS

Referring now to the single FIGURE, a schematic view of an Intrinsically Safe matrix keypad in accordance with the present invention is shown.

DESCRIPTION OF THE PREFERRED EMBODIMENT

The single FIGURE is a schematic representation of an Intrinsically Safe matrix keypad in accordance with the present invention. A bold demarcation line identified at 10 separates the hazardous area (right side) from the non-hazardous area. (left side) Accordingly, when intrinsic safety is required, all circuitry to the right of line 10 must be intrinsically safe; while all circuitry to the left of line 10 does not have to be intrinsically safe (e.g. Non IS).

An objective of the present invention is to permit communication between a matrix keypad 12 which is located in the hazardous region and the keyboard scanning logic (e.g. circuitry) which is located outside the hazardous region and is represented by the computer 14. To accomplish this objective, two discrete circuits are utilized (one which is intrinsically safe and another which is not). The two circuits communicate with each other using associated pairs of light emitters and light detectors, rather than hardwired electrical signals as in the prior art.

Turning again to the FIGURE, the IS circuit loated in the hazardous region (right side) will now be described. Matrix keypad 12 is generally comprised of an array of switches 16, 18, 20, and 22 arranged in a fixed number of rows (switches 16, 18 and 20, 22) and a fixed number of columns (switches 16, 20 and 18, 22). It will be appreciated that while the FIGURE depicts an array of four switches with two switches in each row and column, any number of switches in any configuration of rows and columns is contemplated by the present invention.

A single IS barrier 24 supplies power to the keyboard circuitry. As is well known, IS barrier 24 is intended to limit the power available in the hazardous area to a value less than that required to ignite the expected mixture of explosive gases. IS barrier 24 is connected on the low power side (IS side) to light emitting diodes (LED) 26 and 28. In turn, LED's 26 and 28 are connected to switch rows 16, 18, and 20, 22, respectively. Each switch in column 16, 20 and 18, 22 is connected to a light dependent transistor (LDT) 30 and 32, respectively. The LDT may be comprised of any suitable known light responsive switch. During use, IS barrier 24 provides the power to drive the LED's 26 and 28 attached to each row line. When a key 16, 18, 20 or 22 is depressed, coincident to one of the column strobes being asserted, an IS circuit (on the right of line 10) is completed. Thus, from positive (+) electrode of IS barrier 24, low power is sent through LED 26 or 28, then to switch 16, 18, 20 or 22, through LDT 30 or 32 and back to the negative terminal of IS barrier 24.

On the non-hazardous (left) side of line 10, the circuitry includes a pair of LED's 34 and 36 connected to the column strobe circuitry in computer 14 and a pair of LDT's 38 and 40 connected to the row data circuitry in computer 14. It will be appreciated that each LED in the FIGURE has a corresponding LDT in facing relation therewith so that light emitted from an LED will be sensed by the corresponding LDT. Each LED/LDT pair defines an Opto-Coupler so that there are four (4) Opto-Coupler's depicted in the FIGURE. It will also be appreciated that the column strobe circuitry and the row data circuitry in computer 14 defining the keyboard scanning logic are all well known and commercially available.

Keyboard 12 is "active" in the sense that it causes LED's 26 and 28 to emit light. During operation, the column strobes will be repetitively asserted. This will cause the LEDs, 34 or 36, to be illuminated, further causing LDTs, 32 or 30 respectively, to enter a conductive state. Thus, when a key 16-22 is depressed, and one of the column strobes is asserted as discussed above, one of the low power keypad circuits are completed causing light to emit from either LED 26 or 28. The emittted light is sensed by corresponding LDT 38 or 40, which, in turn, sends an electrical signal to row data in computer 14 informing the computer that a key on either row 16, 18 or row 20, 22 of keypad 12 has been depressed. The computer 14, knowing which column strobe was coincidentally asserted, can thereby identify the exact key depressed.

An important feature of the present invention is that by configuring the keypad as an active IS circuit rather than a passive switch matrix, each of the individual row and column lines can be isolated with opto couplers rather than IS barriers. The opto-couplers are substantially smaller, lighter and less expensive than IS barriers. The use of opto-couplers results in another important feature of the present invention, that is, the rqquirement of only a single IS barrier to provide power to the active keypad circuit.

Opto-couplers as described herein are known and commercially available. A preferred opto-coupler is sold by Opcoa Inc. of Connecticut as Number OPL1264. Similarly, the IS barriers are known and commercially available. A preferred IS barrier is available from Pepperl and Fuchs of Oldham, England and identified as Type ZG17/EX.

The keypad 12 may be comprised of any known membrane keyboard usually consisting of flat or domed spaced flexible insulative sheets having circuitry formed thereon in facing relation.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A matrix keypad comprising:
   keypad means including an array of switches defining at least one column of switches and at least one row of switches;
   first opto-coupler means associated with each row of switches;
   second opto-coupler means associated with each column of switches; and
   a single intrinsically safe barrier means being connected to said first opto-coupler means, said second opto-coupler means and said array of switches.

2. The keypad of claim 1 including:
   keypad scanning logic means communicating with said first opto-coupler means and said second opto-coupler means; and
   wherein, upon closure of a switch, said first and second opto-coupler means provide said keyboard scanning logic means with the row and column of the closed switch thereby identifying the closed switch.

3. The keypad of claim 2 wherein said first and second opto-coupler means comprise light emitter means associated with and spaced from light responsive means and wherein:
   each of said switches in said row and column of switches are connected to said light emitter means of said first opto-coupler means and said light responsive means of said second opto-coupler means; and
   and wherein said keypad scanning logic means communicates with said light responsive means of said first opto-coupler means and said light emitter means of said second opto-coupler means.

4. The keypad of claim 3 wherein:
   said barrier means is connected to said light emitter means of said first opto-coupler means and said light responsive means of said second opto-coupler means.

5. The keypad of claim 3 wherein said light emitter means comprises:
   a light emitting diode.

6. The keypad of claim 3 wherein said light responsive means comprises:
   a light dependent transistor.

7. The keypad of claim 5 wherein said light responsive means comprises:
   a light dependent transistor.

8. The keypad of claim 2 wherein:
   said keypad scanning logic means is stored in a computer.

9. The keypad of claim 3 wherein:
   said keypad scanning logic means is stored in a computer.

10. The keypad of claim 3 wherein:
    said light emitter means of said first opto-coupler means and said light responsive means of said second opto-coupler means and said array of switches and said barrier means are all connected in a first circuit.

11. The keypad of claim 3 wherein:
    said light detector means of said first opto-coupler means and said light responsive means of said second opto-coupler means and said barrier means are connected in a second circuit.

12. The keypad of claim 11 wherein:
    said light detector means of said first opto-coupler means and said light responsive means of said second opto-coupler means and said barrier means are connected in a second circuit.

* * * * *